(12) United States Patent
Burdette et al.

(10) Patent No.: US 12,392,037 B2
(45) Date of Patent: Aug. 19, 2025

(54) FLOATING TOOLING ASSEMBLY FOR CHEMICAL VAPOR INFILTRATION

(71) Applicant: Raytheon Technologies Corporation, Farmington, CT (US)

(72) Inventors: Alyson T. Burdette, Gilbertsville, PA (US); Raymond Surace, Newington, CT (US); Jon Erik Sobanski, Glastonbury, CT (US)

(73) Assignee: RTX Corporation, Farmington, CT (US)

( * ) Notice: Subject to any disclaimer, the term of this patent is extended or adjusted under 35 U.S.C. 154(b) by 0 days.

(21) Appl. No.: 17/970,990

(22) Filed: Oct. 21, 2022

(65) Prior Publication Data

US 2024/0133034 A1 Apr. 25, 2024
US 2024/0229239 A9 Jul. 11, 2024

(51) Int. Cl.
*C23C 16/458* (2006.01)
*C23C 16/04* (2006.01)

(52) U.S. Cl.
CPC .......... *C23C 16/458* (2013.01); *C23C 16/045* (2013.01)

(58) Field of Classification Search
CPC .. C23C 16/045; C23C 16/458; C23C 16/4587
See application file for complete search history.

(56) References Cited

U.S. PATENT DOCUMENTS

| | | | | |
|---|---|---|---|---|
| 3,895,084 A * | 7/1975 | Bauer | ................. | C04B 35/5607 264/296 |
| 7,892,646 B1 | 2/2011 | Rudolph et al. | | |
| 10,780,498 B2 | 9/2020 | Cousineau et al. | | |
| 10,906,842 B2 | 2/2021 | Shi et al. | | |
| 2013/0101406 A1 * | 4/2013 | Kweder | ............. | B29D 99/0028 428/113 |
| 2016/0167269 A1 * | 6/2016 | Pautard | ................. | F04D 29/324 264/259 |
| 2022/0170143 A1 | 6/2022 | Bouvier et al. | | |

FOREIGN PATENT DOCUMENTS

| | | |
|---|---|---|
| CN | 107266099 A | 10/2017 |
| CN | 110722718 B | 10/2021 |
| CN | 114105663 A | 3/2022 |
| FR | 3021671 A1 | 12/2015 |

OTHER PUBLICATIONS

Translation of CN 107266099 (Year: 2017).*
Extended European Search Report for EP Application No. 23205008.8, dated Mar. 27, 2024, 8 pages.

* cited by examiner

*Primary Examiner* — Parviz Hassanzadeh
*Assistant Examiner* — Nathan K Ford
(74) *Attorney, Agent, or Firm* — Kinney & Lange, P.A.

(57) ABSTRACT

A tooling assembly suitable for use in infiltrating a fibrous preform comprises an outer tooling fixture and an inner tooling fixture. The outer tooling fixture comprises a first portion removably attached to a second portion, and a first pair of oppositely disposed windows defined by the first portion and the second portion. Each of the first portion and the second portion comprise a base with a recess. The inner tooling fixture comprises a body defined by at least one portion, the body configured to at least partially surround the fibrous preform, a plurality of holes extending through a thickness of the at least one portion, each hole of the plurality of holes having a length (L) and a diameter (D), and a first neck region engageable with a recess of the first portion or the second portion.

20 Claims, 3 Drawing Sheets

FLOATING TOOLING ASSEMBLY FOR CHEMICAL VAPOR INFILTRATION

BACKGROUND

The present invention relates to chemical vapor infiltration (CVI), and more particularly to improved tooling for CVI.

Ceramic matrix composite (CMC) parts are widely fabricated by densifying preforms made from woven fabrics or oriented/braided fiber tows. CVI is a commonly used densification technique practiced in industry. To keep the preforms in a rigid form and maintain proper shape and geometry, perforated tooling can be used to hold the preforms during the initial densification cycle(s). Holes in the tooling allow vaporous precursors to infiltrate into the preform for the deposition of a ceramic matrix. Tooling for simple preform shapes can be designed with uniform hole lengths. When used with complexly-shaped preforms such as turbine airfoils, such holes can be too long to allow vaporous precursors to sufficiently infiltrate the preform at certain locations. Thus, a need exists for improved tooling.

SUMMARY

A tooling assembly suitable for use in infiltrating a fibrous preform comprises an outer tooling fixture and an inner tooling fixture. The outer tooling fixture comprises a first portion removably attached to a second portion, and a first pair of oppositely disposed windows defined by the first portion and the second portion. Each of the first portion and the second portion comprise a base with a recess. The inner tooling fixture comprises a body defined by at least one portion, the body configured to at least partially surround the fibrous preform, a plurality of holes extending through a thickness of the at least one portion, each hole of the plurality of holes having a length (L) and a diameter (D), and a first neck region engageable with a recess of the first portion or the second portion.

A method of arranging a fibrous preform in a tooling assembly for chemical vapor infiltration (CVI) comprises assembling an inner tooling fixture around the fibrous preform, inserting a first neck region of the inner tooling fixture to a recess in a first portion of an outer tooling fixture, inserting a second neck region of the inner tooling fixture to a recess in a second portion of the outer tooling fixture, and securing the first portion of the outer tooling fixture to the second portion of the outer tooling fixture.

Figure 1:
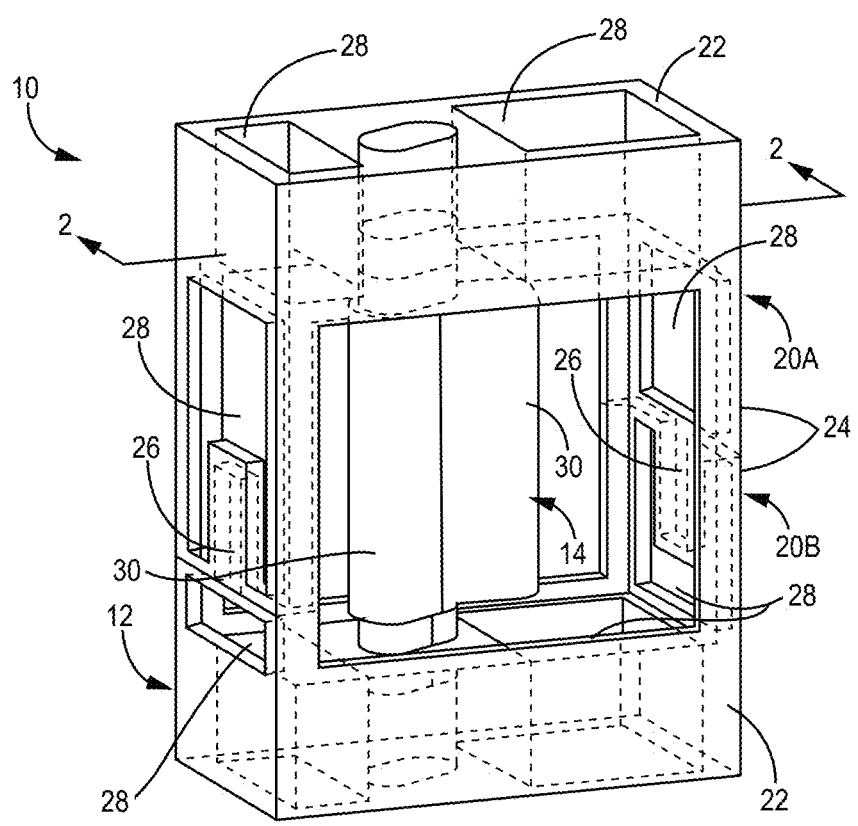
FIG. 1 is a perspective view of a tooling assembly, including an inner fixture and an outer fixture.

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION

This disclosure presents a multipiece tooling assembly for CVI. The assembly includes inner tooling conformal to the perform geometry such that the preform surface is uniformly offset from the external environment. The inner tooling can be placed within outer tooling for support during CVI. The outer tooling design includes large windows that minimally obstruct the inner tooling from the flow of vaporous precursors.

Figure 2:
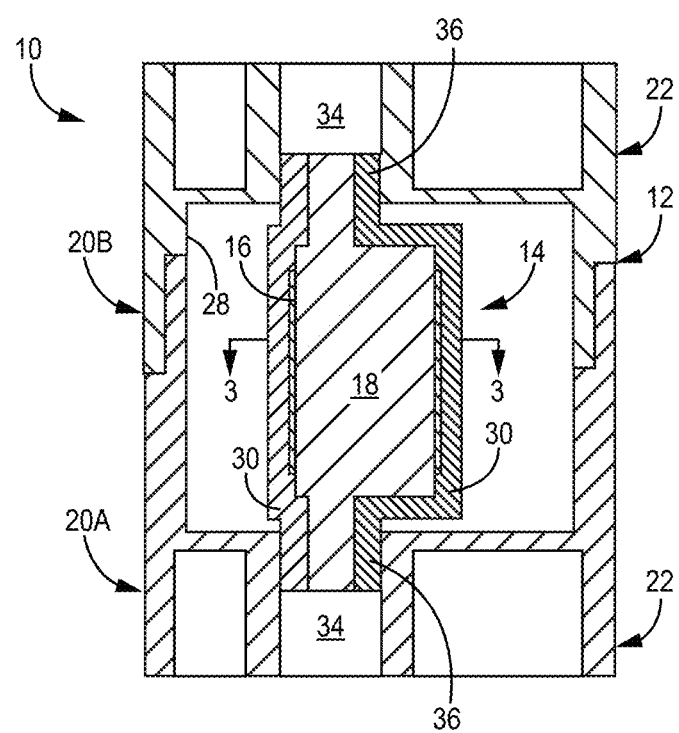
FIG. 2 is a cross-sectional view of the tooling assembly taken along line 2-2 of FIG. 1.
Figure 3:
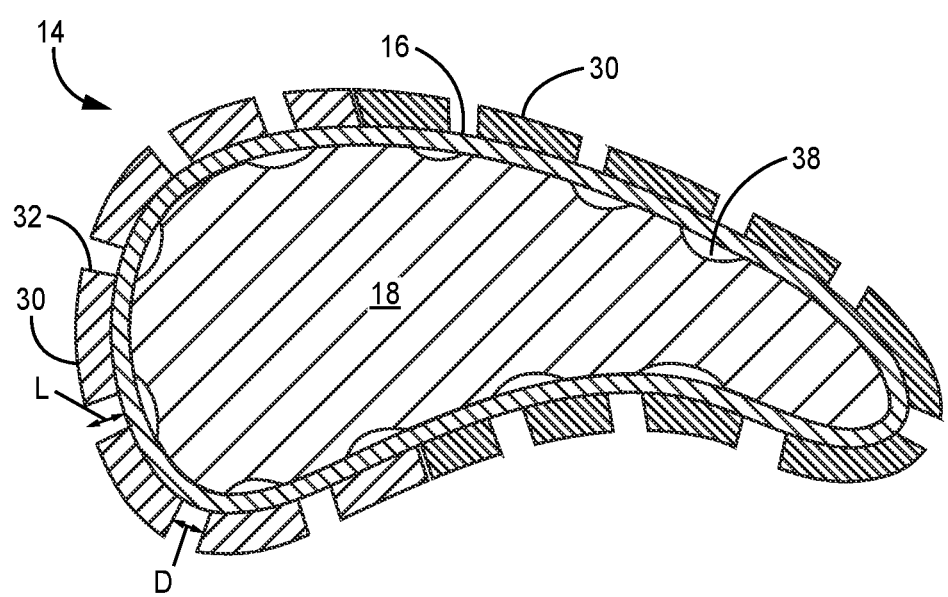
FIG. 3 is a simplified cross-sectional view of a mandrel-mounted preform contained within the inner fixture, taken along line 3-3 of FIG. 2.

FIG. 1 is a perspective view of tooling assembly 10. FIG. 2 is a cross-sectional view of tooling assembly 10 taken along line 2-2 of FIG. 1 and inverted vertically. FIG. 3 is a simplified cross-sectional view of inner tooling fixture 14, taken along line 3-3 of FIG. 2. FIGS. 1-3 are discussed together.

Tooling assembly 10 includes outer tooling fixture 12 and inner tooling fixture 14. Inner tooling fixture 14 can at least partially surround and helps maintain the shape of fibrous preform 16 (FIGS. 2 and 3), which, as best seen in FIG. 3, includes an airfoil (e.g., of a blade or vane), and can include an inner diameter (ID) and/or outer diameter (OD) platform in some embodiments. In an alternative embodiment, preform 16 can have an alternative (e.g., planar) geometry. In an exemplary embodiment, preform 16 can be formed from tows of silicon carbide (SiC) fibers arranged in one of various two or three-dimensional woven architectures such as plain, harness (e.g., 3, 5, 8, etc.), twill, braid, or non-symmetric to name a few non-limiting examples. In an alternative embodiment, preform 16 can be formed from non-woven (e.g., chopped, felted, etc.) fibers. Preform 16 is mounted on and supported by mandrel 18, although a mandrel need not be used for all types of preforms. Each of outer tooling fixture 12, inner tooling fixture 14, and mandrel 18 can be formed from graphite in an exemplary embodiment. Portions of outer tooling fixture 12 and/or inner tooling fixture 14 can additionally and/or alternatively be formed from refractory metal alloys, non-graphitic forms of carbon (e.g., carbon-carbon composites) and/or ceramics (e.g., SiC). Such features can include, for example, locating pins.

Outer tooling fixture 12 can be formed from multiple portions, which as shown in FIGS. 1 and 2, are generally u-shaped upper and lower portions (or halves) 20A and 20B, respectively. In the embodiment shown in the figures, each of upper portion 20A and lower portion 20B includes base 22 and oppositely disposed arms/sides 24 extending away from base 22. Upper portion 20A and lower portion 20B can be removably attached to one another by tabs 26, one tab 26 shown on an arm 24 of each upper portion 20A and lower portion 20B, which are engageable with corresponding slots (not visible in the figures) in arms 24 of lower portion 20B and upper portions portion 20A, respectively. In an alternative embodiment, tabs 26 can be on just one of upper portion 20A or lower portion 20B, or other connecting/interlocking means, such as one or more pins disposed similarly to tabs 26, or clips and wedges can be used. In yet another alternative embodiment, one of upper portion 20A or lower portion 20B can include base 22 and arms 24, and the other of upper portion 20A or lower portion 20B can include just base 22. Other features and shapes for outer tooling fixture 12 are contemplated herein.

Outer tooling fixture 12 can have an overall cuboidal geometry with bases 22 and arms 24 being flat to facilitate placement of tooling assembly 10 into a CVI reactor or on a benchtop during assembly. Outer tooling fixture 12 can further include variously sized windows 28 on each of its sides, with some relatively smaller (i.e., in area) windows 28 on arms 24, and some relatively larger windows 28 orthogonally positioned relative to smaller windows 28 of arms 24, and defined by both upper portion 20A and lower portion 20B when assembled. Similarly sized (i.e., larger or smaller) windows 28 can be oppositely disposed from one another in an exemplary embodiment. The arrangement with bases 22, arms 24, and windows 28 ensures that outer tooling fixture 12 can adequately support inner tooling fixture 14 while the flow of vaporous precursors can reach inner tooling fixture 14 with minimal obstruction from outer tooling fixture 12.

Inner tooling fixture 14 can also include multiple portions, with two portions 30 shown in FIGS. 1-3 defining the body of inner tooling fixture 14. Although shown in FIGS. 2 and 3 with different hatching to facilitate visualization of individual portions 30, both can be formed from the same material. Portions 30 can be assembled to define a body with one or more curved segments corresponding to airfoil-shaped preform 16. In an alternative embodiment, the body of inner tooling fixture 14 can be defined by a single portion 30 or more than two portions 30 depending, for example, on the complexity of the preform geometry. Inner tooling fixture 14 further includes infiltration holes 32 (FIG. 3) disposed throughout inner tooling fixture 14 and extending through a thickness the respective portion 30. Holes 32 can be positioned to align with one or more of the leading and trailing edges of airfoil-shaped preform 16, as well as the pressure and suction sides and gaspath endwall/platform surfaces. Holes 32 can further be disposed along inner tooling fixture 14 in the longitudinal (i.e., spanwise) direction. Holes 32 place preform 16 in flow communication with the internal volume of the CVI reactor and allow vaporous precursors to reach an infiltrate preform 16.

To facilitate a more even distribution and infiltration of vaporous precursors throughout preform 16, inner tooling fixture 14 is conformal to the curvature of preform 16 such that a depth, or length L of each hole 32 is generally the same throughout internal tooling fixture 14. Accordingly, preform 16 is uniformly offset from the environment (i.e., internal volume of the CVI reactor) with a substantially uniform path length (i.e., L) for the vaporous precursors through internal tooling fixture 14. Each hole 32 also has a diameter D. Furthermore, each hole 32 is generally normal to the surface of preform 16 such that the flow of vaporous precursors through each hole 32 is also normal to the surface of preform 16. Although holes 32 are shown with a generally cylindrical cross-sectional geometry, alternative geometries (e.g., frustoconic al) are contemplated herein.

Inner tooling fixture 14 can be mounted within outer tooling fixture 12 via floating attachment. More specifically, each base 22 of outer tooling fixture 12 includes recesses 34 (FIG. 2) for receiving a corresponding neck region 36 (FIG. 2) on opposite ends of inner tooling fixture 14. Optimally, no portion of preform 16 extends into neck region 36. With this arrangement, inner tooling fixture 14 is minimally engaged with, but still adequately supported by outer tooling fixture 12. Recesses 34 can be open such to place inner tooling fixture 12 in flow communication with the environment (e.g., internal volume of the CVI reactor).

Mandrel 18 can include grooves 38 along its outer surface (i.e., the surface in communication with preform 16. Grooves 38 can act as a flow path for vaporous precursors along the inner (i.e., mandrel-facing) surface of preform 16.

Such a flow can, for example, access mandrel 18 from recesses 34 of outer tooling fixture 12.

To use tooling assembly 10 for CVI, preform 16 can be laid up around mandrel 18, and portions 30 of inner tooling fixture 14 assembled over preform 16. The lower neck region 36 of inner tooling fixture 14 can be inserted into the corresponding recess 34 of base 22 of lower portion 20B. The upper neck region 36 can then be inserted into the corresponding recess 34 of base 22 of upper portion 20A, and tabs 26 inserted into the corresponding slots to secure upper portion 20A to lower portion 20B, and internal tooling fixture 14 within outer tooling fixture 12. Once secured, tooling assembly 10 can be placed into the CVI reactor and exposed to the flow of vaporous precursors.

Tooling assembly 10 can be used when infiltrating preform 16, via CVI, to deposit interface coatings (e.g., layers of BN, SiC, Si-doped BN, etc.) and/or to form a matrix (e.g., SiC) to create a CMC part. Such CMC parts can be incorporated into aerospace, maritime, or industrial equipment, to name a few, non-limiting examples.

Discussion of Possible Embodiments

The following are non-exclusive descriptions of possible embodiments of the present invention.

A tooling assembly suitable for use in infiltrating a fibrous preform comprises an outer tooling fixture and an inner tooling fixture. The outer tooling fixture comprises a first portion removably attached to a second portion, and a first pair of oppositely disposed windows defined by the first portion and the second portion. Each of the first portion and the second portion comprise a base with a recess. The inner tooling fixture comprises a body defined by at least one portion, the body configured to at least partially surround the fibrous preform, a plurality of holes extending through a thickness of the at least one portion, each hole of the plurality of holes having a length (L) and a diameter (D), and a first neck region engageable with a recess of the first portion or the second portion.

The assembly of the preceding paragraph can optionally include, additionally and/or alternatively, any one or more of the following features, configurations and/or additional components:

In the above assembly, each of the inner tooling fixture and the outer tooling fixture can be formed from graphite.

In any of the above tooling fixtures, the first portion of the outer tooling fixture can further include first pair of oppositely disposed arms extending away from the base.

In any of the above tooling fixtures, the second portion of the outer tooling fixture can further include a second pair of oppositely disposed arms extending away from the base.

In any of the above tooling fixtures, one arm of the first pair of arms can include a tab, and a corresponding arm of the second pair of arms can include a slot for receiving the tab.

In any of the above tooling fixtures, the first portion of the outer tooling fixture can further include a second pair of oppositely disposed windows. One window of the second pair of windows can be disposed within one arm of the first pair of arms, and the other window of the second pair of windows can be disposed within the other arm of the first pair of arms.

In any of the above tooling fixtures, the first pair of windows can be disposed orthogonally to the second pair of windows.

In any of the above tooling fixtures, each window of the first pair of windows can be larger than each window of the second pair of windows.

In any of the above tooling fixtures, the inner tooling fixture can further include the first neck region engageable with the recess in the base of the first portion of the outer tooling fixture, and a second neck region engageable with the recess in the base of the second portion of the outer tooling fixture.

In any of the above tooling fixtures, the at least one portion can include a first portion and a second portion, and the body can be curved.

In any of the above tooling fixtures, the body can correspond to a shape of the fibrous preform, and the fibrous preform can include an airfoil.

Any of the above tooling fixtures can further include a mandrel supporting the fibrous preform.

In any of the above tooling fixtures, the fibrous preform can further include a platform.

In any of the above tooling fixtures, each hole of the plurality of holes can be oriented normal to a surface of the preform.

In any of the above tooling fixtures, each hole of the plurality of holes can have a cylindrical cross-sectional geometry.

A method of arranging a fibrous preform in a tooling assembly for chemical vapor infiltration (CVI) comprises assembling an inner tooling fixture around the fibrous preform, inserting a first neck region of the inner tooling fixture to a recess in a first portion of an outer tooling fixture, inserting a second neck region of the inner tooling fixture to a recess in a second portion of the outer tooling fixture, and securing the first portion of the outer tooling fixture to the second portion of the outer tooling fixture.

The method of the preceding paragraph can optionally include, additionally and/or alternatively, any one or more of the following features, configurations and/or additional components:

In the above method, securing the first portion to the second portion can include inserting a tab or a pin in the first portion into a slot in the second portion.

Any of the above methods can further include laying-up the fibrous preform around a mandrel prior to the step of assembling the inner tooling fixture around the fibrous preform.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A tooling assembly suitable for use in infiltrating a fibrous preform, the tooling assembly comprising:
   an outer tooling fixture defining an interior volume, the outer tooling fixture comprising:
      a first portion;
      a second portion, wherein the first portion is removably attached to the second portion, each of the first portion and the second portion comprising a base with a recess; and
      a first pair of oppositely disposed windows, each window providing an opening to the interior volume, a perimeter of the opening defined by the first portion, the second portion, or a combination thereof; and
   an inner tooling fixture insertable into the outer tooling fixture and disposed entirely within the interior volume, the inner tooling fixture comprising:
      a body defined by at least one portion, the body configured to at least partially surround the fibrous preform;
      a plurality of holes extending through a thickness of the at least one portion, each hole of the plurality of holes having a length (L) and a diameter (D); and
      a first neck region engageable with the recess of the first portion or the second portion; and
   wherein the first pair of windows is open to and spaced apart from the inner tooling fixture and the plurality of holes of the inner tooling fixture such that a flow of vaporous precursors is permitted through the first pair of windows to openings of the plurality of holes of the inner tooling fixture.

2. The assembly of claim 1, wherein the first portion of the outer tooling fixture further comprises a first pair of oppositely disposed arms extending away from the base.

3. The assembly of claim 2, wherein the second portion of the outer tooling fixture further comprises a second pair of oppositely disposed arms extending away from the base.

4. The assembly of claim 3, wherein one arm of the first pair of arms comprises a tab, and wherein a corresponding arm of the second pair of arms comprises a slot for receiving the tab.

5. The assembly of claim 3, wherein the first portion of the outer tooling fixture further comprises a second pair of oppositely disposed windows open to and separate from the inner tooling fixture, wherein one window of the second pair of windows is disposed within one arm of the first pair of arms, and wherein the other window of the second pair of windows is disposed within the other arm of the first pair of arms.

6. The assembly of claim 5, wherein the first pair of windows is disposed orthogonally to the second pair of windows.

7. The assembly of claim 6, wherein each window of the first pair of windows is larger than each window of the second pair of windows.

8. The assembly of claim 5, wherein the second portion of the outer tooling fixture further comprises a third pair of oppositely disposed windows open to and separate from the inner tooling fixture, wherein one window of the third pair of windows is disposed within one arm of the second pair of arms, and wherein the other window of the third pair of windows is disposed within the other arm of the second pair of arms.

9. The assembly of claim 5, wherein the outer tooling fixture further comprises a third pair of oppositely disposed windows open to and separate from the inner tooling fixture, wherein one window of the third pair of windows is disposed within the base of the first portion and the other window of the third pair of windows is disposed within the base of the second portion.

10. The assembly of claim 1, wherein the inner tooling fixture further comprises:
    the first neck region engageable with the recess in the base of the first portion of the outer tooling fixture; and
    a second neck region engageable with the recess in the base of the second portion of the outer tooling fixture.

11. The assembly of claim 1, wherein the at least one portion of the body of the inner tooling fixture comprises a third portion and a fourth portion separable from the third portion, and wherein a combined outer surface of the third portion and the fourth portion has a shape corresponding to a shape of the fibrous preform.

12. The assembly of claim 11, wherein the fibrous preform comprises an airfoil.

13. The assembly of claim 11 and further comprising: a mandrel supporting the fibrous preform.

14. The assembly of claim 1, wherein each hole of the plurality of holes is oriented normal to a surface of the preform.

15. The assembly of claim 1, wherein each hole of the plurality of holes has a cylindrical cross-sectional geometry.

16. The assembly of claim 1, wherein the plurality of holes has a uniform length.

17. The assembly of claim 1, wherein the recess in the first base is disposed in a first surface and the recess in the second base is disposed in a second surface, the second surface facing the first surface.

18. A method of arranging a fibrous preform in a tooling assembly for chemical vapor infiltration (CVI), the method comprising:
   assembling an inner tooling fixture around the fibrous preform, wherein the inner tooling fixture comprises:
      a body defined by at least one portion, the body configured to at least partially surround the fibrous preform;
      a plurality of holes extending through a thickness of the at least one portion, each hole of the plurality of holes having a length (L) and a diameter (D); and
      first and second neck regions;
   inserting the first neck region of the inner tooling fixture into a recess in a first portion of an outer tooling fixture;
   inserting the second neck region of the inner tooling fixture into a recess in a second portion of the outer tooling fixture; and
   securing the first portion of the outer tooling fixture to the second portion of the outer tooling fixture wherein the outer tooling fixture comprises:
      the first portion;
      the second portion, wherein the first portion is removably attached to the second portion, each of the first portion and the second portion comprising a base with the recess; and
      a first pair of oppositely disposed windows each window providing an opening to the interior volume, a perimeter of the opening defined by the first portion, the second portion, or a combination thereof;
      wherein the outer tooling fixture defines an interior volume and wherein the inner tooling fixture is disposed entirely within the interior volume; and
      wherein the first pair of windows is open to and spaced apart from the inner tooling fixture and the plurality of holes of the inner tooling fixture such that a flow of vaporous precursors is permitted through the first pair of windows to openings of the plurality of holes of the inner tooling fixture.

19. The method of claim 18, wherein securing the first portion to the second portion comprises: inserting a tab or a pin in the first portion into a slot in the second portion.

20. The method of claim 18, and further comprising: laying-up the fibrous preform around a mandrel prior to the step of assembling the inner tooling fixture around the fibrous preform.

\* \* \* \* \*

UNITED STATES PATENT AND TRADEMARK OFFICE
CERTIFICATE OF CORRECTION

| | | |
|---|---|---|
| PATENT NO. | : 12,392,037 B2 | Page 1 of 1 |
| APPLICATION NO. | : 17/970990 | |
| DATED | : August 19, 2025 | |
| INVENTOR(S) | : Alyson T. Burdette, Raymond Surace and Jon Erik Sobanski | |

It is certified that error appears in the above-identified patent and that said Letters Patent is hereby corrected as shown below:

In the Specification

Column 3, Line 51-52:
Delete "frustoconic al"
Insert --frustoconical--

Signed and Sealed this
Sixteenth Day of September, 2025

Coke Morgan Stewart
*Acting Director of the United States Patent and Trademark Office*